United States Patent [19]

Cavanna

[11] 4,198,024

[45] Apr. 15, 1980

[54] PRINTED CIRCUIT CARD HOLDER

[75] Inventor: Peter J. Cavanna, Coral Springs, Fla.

[73] Assignee: Burroughs Corporation, Detroit, Mich.

[21] Appl. No.: 850,330

[22] Filed: Nov. 10, 1977

[51] Int. Cl.² ............................................ F16M 13/00
[52] U.S. Cl. .............................. 248/544; 248/309 R; 211/41; 361/399; 361/413
[58] Field of Search ....................... 361/413, 415, 399; 211/41, 45; 339/91 R, 17 LM; 312/183, 185, 193; 248/309, 452, 453, 544

[56] References Cited

U.S. PATENT DOCUMENTS

| | | | |
|---|---|---|---|
| 3,216,580 | 11/1965 | Fricker, Jr. | 211/41 |
| 3,682,356 | 8/1972 | Lovell et al. | 361/415 |
| 4,089,042 | 5/1978 | Torburn | 361/399 |

FOREIGN PATENT DOCUMENTS 2516746  10/1976  Fed. Rep. of Germany ........... 361/399

OTHER PUBLICATIONS

Goplen et al., "Retainer for Cable Connector" *IBM Tech. Disc. Bull.* vol. 16, No. 12, pp. 4016-4017 May 1974.

*Primary Examiner*—David Smith, Jr.
*Attorney, Agent, or Firm*—Kevin R Peterson; Edward J. Feeney, Jr.; James E. Ledbetter

[57] ABSTRACT

A unitary retention arm or holder for use with a printed circuit card or board. The holder comprises an elongated L-shaped arm of generally rectangular cross section, being wider at its base than at its L-shaped opposite end. The L-shaped end has a narrow channel formed therein for receiving the edge of a printed circuit card, with a guiding ramp or chamfer leading to the channel. A threaded bolt is molded into the base of the holder. The holder is formed from a slightly flexible plastic.

In operation, the holder is attached to a printed circuit card frame or cage or other support means with its base bolted near individual card connectors. A printed circuit card having edge connectors is inserted into its appropriate card connector, the card holder is flexed away from its associated printed circuit card, and then the outer edge of the printed circuit card is pressed into the channel formed in the L-shaped end of the holder. The holder may then be released and will hold the printed circuit card firmly in a perpendicular position with respect to the card edge connector. To release the holder, the operator pulls outwardly on the outer edge of the L-shaped leg of the holder, thus allowing the printed circuit card to slip out of the channel formed in the L-shaped leg.

There is also described a two-piece telescoping printed circuit card holder having releasably lockable fastening means to adjust the length of the card holder for various sizes of printed circuit cards.

5 Claims, 4 Drawing Figures

U.S. Patent  Apr. 15, 1980  4,198,024
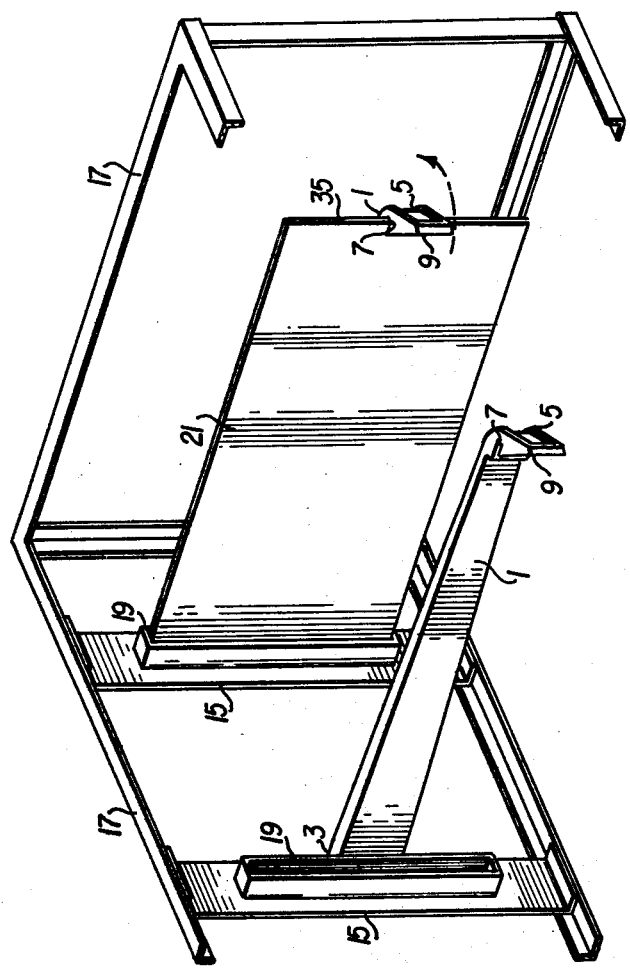
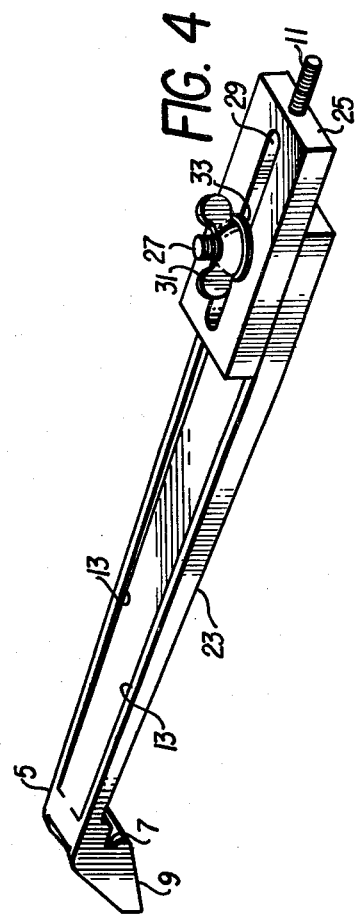
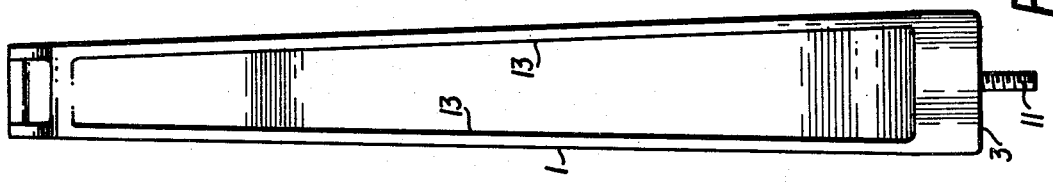
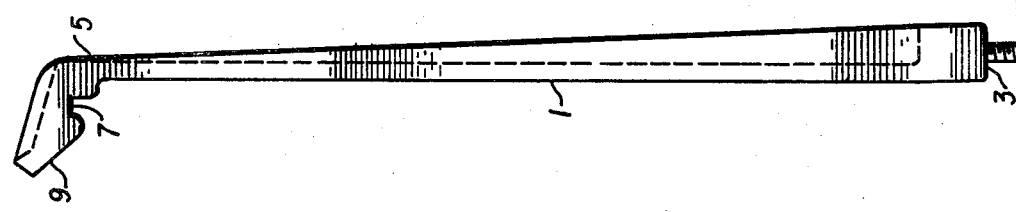

PRINTED CIRCUIT CARD HOLDER

BACKGROUND OF THE INVENTION

1. Field of the Invention

The invention relates to printed circuit card holders.

2. Description of the Prior Art

Printed circuit cards or boards have been used for many years in electronic equipment. Such boards have the virtue of allowing many electrical devices and components to be readily connected by metallic pathways formed on one or more surfaces of the board. Increasingly, modern day electronic equipment manufactures have turned to plug-in module boards, representing whole sub-systems of electronic apparatus such as an amplifier, counter, or power supply, to aid in equipment assembly and diagnostic trouble-shooting. Generally, such circuit boards are provided with a plurality of electrical contact pads or connections along one edge of the card. The entire board is then press-fitted into a specially designed edge connector having a plurality of mating contacts. Electrical connection between the card edge connector and other devices in the electrical apparatus is generally made through means of separate wiring, or as is more common, by means of multi-wire flat cable.

Though printed circuit (PC) cards or boards are press fitted into card edge connectors generally these connectors do not grip the edge of an inserted board with any appreciable strength. Additionally, a PC card may need to be mounted horizontally, vertically, or in some other configuration, or be subject to vibration as in an aircraft environment. The prior art has recognized that some form of support and retention means must be provided in order to securably hold a PC board in position in its associated card edge connector. Since it is ordinarily convenient to have all PC cards near each other in electrical apparatus prior art PC board supports or holders have generally taken the form of a box-like frame or cage for housing a plurality of PC cards. Usually all the card edge connectors are parallely mounted along one side of the cage, generally known as the backplane, for convenience in wiring or interconnection between these card edge connectors. Prior art apparatus generally have associated with each card edge connector a pair of U-shaped channels for guiding and supporting a PC card. PC cards are slipped into these U-shaped channel members which act to keep the PC boards arranged in a spaced apart, parallel facing relationship. A slight air-space between each PC card is necessary to allow circulating air to cool the various electrical devices mounted on the PC cards.

It has been recognized by prior art workers that it is not enough to merely guide and support the PC cards, but that each card must be securely fastened or held within its U-shaped channel in order to ensure that a proper electrical connection is made at all times between the PC card connection pads and its associated card edge connector.

The prior art has attempted to overcome this problem by providing releasable locking means associated with the PC cards or their guides for securely holding the PC cards within the guides, while still allowing a mounted PC card to be readily removed from the card cage. These locking means have taken various forms. For instance, U.S. Pat. Nos. 3,853,379, 3,767,974, and 3,764,857 disclose the use of a camming lever locking means provided on the outward ends of each channel-type guide engagable with the outer corners of its associated PC card. Another version of this same concept, shown in U.S. Pat. No. 3,798,507 uses a camming lever locking means provided only on the outward corners of the PC card. Another type of camming lever locking means is shown in U.S. Pat. No. 3,784,954 in which levers having an arcuate slot formed therein disposed near the card edge connector engage a bolt provided near the connection pad end of the PC card. However, the above types of locking PC card supports all suffer from the obvious disadvantages of being relatively complex to manufacture and assemble and requiring at least two locking means to securely hold each PC board. Additionally, most of these types of prior art devices require a special or modified type of PC board to be used with the locking and guiding means.

Another type of PC card support arrangement is shown in U.S. Pat. No. 3,863,113 in which separate, movable wireform card guides mounted upon transverse rods are used to hold inserted PC cards. The ends of the wireform guides hook over the outer corners of the PC cards. However, this arrangement requires a specially shaped corner on the PC card and still requires two wireform guides for each PC card to be mounted. Similarly, U.S. Pat. No. 3,741,513 shows separate, movable and resiliently bowed U-shaped channel members which act to support and retain an inserted PC card. However, this device suffers from the disadvantage that in high vibration environments (e.g. aircraft) an inserted board may still move parallel to the card guides and work as way out of its associated card edge connector.

A final type of PC card support is shown in U.S. Pat. No. 3,715,630 in which a pair of opposing flexible latching members are mounted on a U-shaped card guide and have a cut-out formed on their outer ends for releasable engagement with the corners of an inserted PC card. However, this device suffers from the disadvantage of requiring a pair of latching devices and a pair of associated U-shaped channel guides for each PC card to be mounted.

SUMMARY OF THE INVENTION

These and other problems of prior art devices are overcome in the present invention by providing a printed circuit card holder comprising an elongated substantially L-shaped arm of generally rectangular cross-section, being wider at its base than at its L-shaped opposite end. A narrow channel is formed in the L-shaped end for receiving the edge of a printed circuit card, with a guiding chamfer formed on the outer end of the L-shaped end for guiding the printed circuit card edge into the receiving channel.

The holder is attached to the backplane area of a printed circuit card cage or other support means near its associated card edge connector by means of a threaded bolt or other mounting means provided in the base of the holder. A printed circuit card having edge connectors may be inserted into its associated card connector by flexing the card holder away from the printed circuit card and then pressing the outer edge of the printed circuit card into the channel formed in the L-shaped end of the holder. The holder may then be released and will hold the printed circuit card firmly in a perpendicular position with respect to the card edge connector. To release the holder, the outer edge of the L-shaped leg of the holder is pulled outwardly, thus allowing the printed circuit card to slip out of the channel formed in the L-shaped leg.

In an alternative embodiment a two-piece telecoping printed circuit card holder is provided having releasable fastening means to adjust the length of the card holder for various sizes of printed circuit cards.

The novel unitary printed circuit card holder of the present invention requires only a single, simply molded article, readily attached to a printed circuit card cage or other support means, to be used to securably and releasably hold a printed circuit card firmly in position with respect to its associated card edge connector. The printed circuit card holder of the present invention thus allows a plurality of standard, unmodified printed circuit cards to be quickly mounted in any position while still allowing ready insertion and removal of the printed circuit cards. Additionally, unlike prior art devices the card holder of the present invention is free-standing and requires only a small mounting area near its base. As a result, conventional printed circuit card frames or cages used to support printed circuit cards and their mounting apparatus may be dispensed with, if desired. It will also be noted that one of the chief advantages of the present invention, aside from its low cost and simplicity, is that only one such holder is needed for each printed circuit card to be mounted. Further, in the alternative embodiment, varying sizes and lengths of printed circuit cards can be easily accommodated in one card cage without the need for specially adapted mounting brackets or channels.

BRIEF DESCRIPTION OF THE DRAWINGS

FIG. 1 is a side view of the printed circuit card holder of the present invention;

FIG. 2 is a rear view of the printed circuit card holder shown in FIG. 1;

FIG. 3 is a perspective view showing the arrangement of the printed circuit card holder, printed circuit card, card edge connector, and card cage as used in the present invention;

FIG. 4 is a perspective view of an alternative embodiment of the card holder of the present invention showing an adjustable length feature.

DESCRIPTION OF THE PREFERRED EMBODIMENT

With reference to FIG. 1, there is shown a side view of the novel printed circuit (PC) card holder of the present invention. The holder 1 takes the form of an elongated L-shaped arm of generally rectangular cross-section, being wider at its base 3 than at the neck of its latching end 5. This tapered shape of holder 1 merely adds a small amount of flexibility and is not critical to the operation of the present invention. Latching end 5 is shown as being approximately L-shaped in form and having a narrow channel 7 formed therein with a guiding ramp or chamfer 9 leading to channel 7. A small threaded bolt 11 is shown molded into the base area 3 of the holder, though other means of attachment will readily suggest themselves to those skilled in the art. It will be noted that although the card holder of the present invention is shown having an L-shaped latching arm, various other forms, such as a T-shape for handling two circuit boards with one holder, would suggest themselves to those skilled in the art.

As shown in FIG. 2, the outer edges of the holder 1 may also include a pair of narrow stiffening ribs 13 running the length of the elongated arm of holder 1 to lend increased rigidity and strength. Holder 1 is preferably formed form a slightly flexible, dimensionally stable plastic material such as Norel N-190 made by the General Electric Co. Of course, other types of materials may be used, including metals of various types, as is well known in the art.

With reference to FIG. 3, there is shown a representative arrangement of the above-described PC card holder as used in a PC card cage holding a plurality of PC cards. Holders 1 are shown bolted at their bases 3 to backplane support members 15 of card cage 17. Each free-standing holder 1 has associated with it a card edge connector 19 also mounted on backplane supports 15. Card edge connectors 19 are of a type well-known in the art having a plurality of contacts for making an electrical connection with metallic conductor pads provided along one edge of a printed circuit card. Card cage 17 is shown only partially and with holders 1 widely separated for ease of understanding the operation of the invention. In practice holders 1 could be placed closer together, or with whatever spacing is desired. Additionally, backplane supports 15 need not be separate, but could be a solid sheet, such as an equipment chassis. Of course a card edge connector 19 and its associated holder 1 need not be mounted parallel to other connectors and holders, and holder 1 may be used to secure a PC card in any orientation, not just horizontally or vertically.

In operation a PC card of appropriate length, such as that labeled 21 in FIG. 3, would be inserted into its associated card edge connector 19. Card holder 1 would then be flexed away from PC board 21. The outer edge 35 of PC card 21 would then be pressed along chamfer 9 of holder 1 until PC card edge 35 slips into channel 7 formed in the L-shaped end of card holder 1. Holder 1 may then be released and will securely hold PC card 21 firmly in a perpendicular position with respect to its associated card edge connector 19. To release the PC board, the operator merely pulls outwardly on the outer edge of L-shaped member 5, thus allowing the outer edge 35 of PC card 21 to slip out of channel 7 formed in L-shaped member 5.

It will be noted that in the practice of the present invention the width of channel 7, as shown in FIG. 1, is not critical and may be made large enough to accommodate most thicknesses of printed circuit boards.

With reference to FIG. 4 there is shown an alternate embodiment of the present invention wherein card holder 1 is made telescopingly adjustable for various lengths of printed circuit boards. In this embodiment PC card holder 1 is divided into two portions: an upper arm portion labeled 23 and a lower telescoping base portion labeled 25. Upper portion 23 retains the general configuration of an elongated arm having an L-shaped end 5, a guiding chamfer 9, a receiving channel 7, and stiffening ribs 13 as described above with respect to FIGS. 1 and 2. However, there is a short threaded bolt 27 perpendicularly mounted in the lower rear area of upper arm 23. Bolt 27 is preferably molded directly into the material forming arm 23. Lower telescoping base 25 has an elongated slot 29 formed therein for receiving threaded bolt 27. A threaded mounting bolt 11 is disposed along the lower end of base 25 as was described with respect to FIGS. 1 and 2. A wing-nut 31, and an associated washer 33 if desired, is then threaded on bolt 27 for releasably adjusting the relative position of upper arm 23 with respect to lower base 25 to accommodate varying sizes of printed circuit boards.

Of course, many other types of base fastening mans, such as bolt 11 and releasable telescoping adjustment means such as threaded bolt 27 and wing-nut 31 would suggest themselves to one skilled in the art and may be used in the practice of the present invention. It will also be recognized that the practice of this invention is not limited solely to use with printed circuit boards, and that other types of relatively rigid planar sheet materials such as panel displays may be accommodated.

While the printed circuit card holder of the present invention has been described in considerable detail, it is understood that various changes, modifications and other applications of the invention may occur to persons of ordinary skill in the art without departing from the spirit and scope of the invention as is defined in the appended claims.

What is claimed is:

1. Planar sheet retention means comprising a retention arm, said retention arm having a base portion and a flexible latching portion, said latching portion having latching means provided thereon for engaging an edge of a planar sheet of material to be retained, said base portion having attachment means provided thereon for mounting said retention arm in a fixed manner to a base support means, said base portion and said latching portion being movably and telescopingly joined by releasably adjustable fastening means attached thereto.

2. The retention means of claim 1 wherein said latching portion includes at least one substantially L-shaped portion provided on said latching portion of said retention arm.

3. The retention means of claim 2 wherein said latching means comprises at least one transverse receiving channel formed in said L-shaped portion of said retention arm.

4. Planar sheet retention means, comprising an elongated retention arm, said arm having a base portion and at least one substantially L-shaped opposite end, said L-shaped end having latching means comprising a transverse receiving channel formed therein for releasably engaging an edge of a planar sheet of material to be retained said edge receiving channel disposed substantially parallel to said edge of said planar sheet material, said L-shaped end further including guiding means formed adjacent said latching means for guiding said edge of said planar sheet into said latching means, said base portion having attachment means provided thereon for mounting said retention arm perpendicularly to a rigid base support member, said retention arm being of sufficient length to securably retain said planar sheet material between said latching means and said base support member.

5. The retention means of claim 4 wherein said guiding means comprises a guiding chamfer inwardly directed along said L-shaped end toward said transverse receiving channel.

* * * * *